(12) United States Patent
Chang et al.

(10) Patent No.: US 10,705,497 B2
(45) Date of Patent: Jul. 7, 2020

(54) FOREIGN OBJECT DETECTION METHOD AND POWER SYSTEM CAPABLE OF DETECTING FOREIGN OBJECT

(71) Applicant: RICHTEK TECHNOLOGY CORPORATION, Zhubei, Hsinchu (TW)

(72) Inventors: Wei-Hsu Chang, HsinChu (TW); Jung-Won Kim, Seoul (KR)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 270 days.

(21) Appl. No.: 15/996,516

(22) Filed: Jun. 3, 2018

(65) Prior Publication Data

US 2018/0373216 A1 Dec. 27, 2018

Related U.S. Application Data

(60) Provisional application No. 62/522,943, filed on Jun. 21, 2017.

(30) Foreign Application Priority Data

Apr. 18, 2018 (CN) .......................... 2018 1 0348859

(51) Int. Cl.
*G05B 19/042* (2006.01)
*G01R 31/08* (2020.01)
(Continued)

(52) U.S. Cl.
CPC ....... *G05B 19/0428* (2013.01); *G01R 31/085* (2013.01); *G01R 31/40* (2013.01);
(Continued)

(58) Field of Classification Search
CPC ........ G05B 19/0428; G05B 2219/2639; G01R 31/66; G01R 31/58; G01R 31/40; G01R 31/085; G01V 3/02
See application file for complete search history.

(56) References Cited

U.S. PATENT DOCUMENTS

2014/0013012 A1* 1/2014 Terlizzi ................... G06F 13/38
710/15
2016/0116509 A1* 4/2016 Kim ....................... G01R 31/69
361/86
(Continued)

*Primary Examiner* — Robert E Fennema
*Assistant Examiner* — Jonathan Michael Skrzycki
(74) *Attorney, Agent, or Firm* — Tung & Associates

(57) ABSTRACT

A power system capable of detecting a foreign object, includes a power supplier side, a power receiver side, and a cable. The power supplier side includes a power converter, a foreign object detection and control circuit, and a pull-up circuit. The power converter supplies a supply voltage to the power receiver side according to a power supply control signal. The foreign object detection and control circuit generates the power supply control signal for controlling the power converter, and generates a foreign object detection and control signal according to a voltage at a supplier transmission node of the power supplier side, for determining whether a foreign object exists in the power receiver side. The pull-up circuit adjusts a level of a supply current which is supplied from the supplier transmission node to the power receiver side.

23 Claims, 6 Drawing Sheets

(51) Int. Cl.
    *G01V 3/02* (2006.01)
    *G01R 31/40* (2020.01)
    *G01R 31/58* (2020.01)
    *G01R 31/66* (2020.01)

(52) U.S. Cl.
    CPC .............. *G01R 31/58* (2020.01); *G01R 31/66* (2020.01); *G01V 3/02* (2013.01); *G05B 2219/2639* (2013.01)

(56) References Cited

U.S. PATENT DOCUMENTS

| | | | | |
|---|---|---|---|---|
| 2018/0062325 | A1* | 3/2018 | Kim | H01R 29/00 |
| 2018/0088067 | A1* | 3/2018 | Gupta | G01R 31/69 |
| 2019/0109480 | A1* | 4/2019 | Hsu | H02J 7/0036 |
| 2019/0341786 | A1* | 11/2019 | Lee | G06F 1/3275 |

\* cited by examiner

| Vccs at Node CCS | | |
|---|---|---|
| aV | | Power supplier terminal 10 not coupled to power receiver terminal 20 |
| bV | | |
| | | Foreign object existing in power receiver terminal 20 |
| cV | | |
| | | Power supplier terminal 10 coupled to power receiver terminal 20 |
| dV | | |
| 0V | | Foreign object existing in power receiver terminal 20 |

Fig. 5A

| Vccs at Node CCS | | |
|---|---|---|
| 5 V | | Power supplier terminal 10 not coupled to power receiver terminal 20 |
| 4 V | | |
| | | Foreign object existing in power receiver terminal 20 |
| 2.6 V | | |
| | | Power supplier terminal 10 coupled to power receiver terminal 20 |
| 0.8 V | | |
| 0 V | | Foreign object existing in power receiver terminal 20 |

Fig. 5B

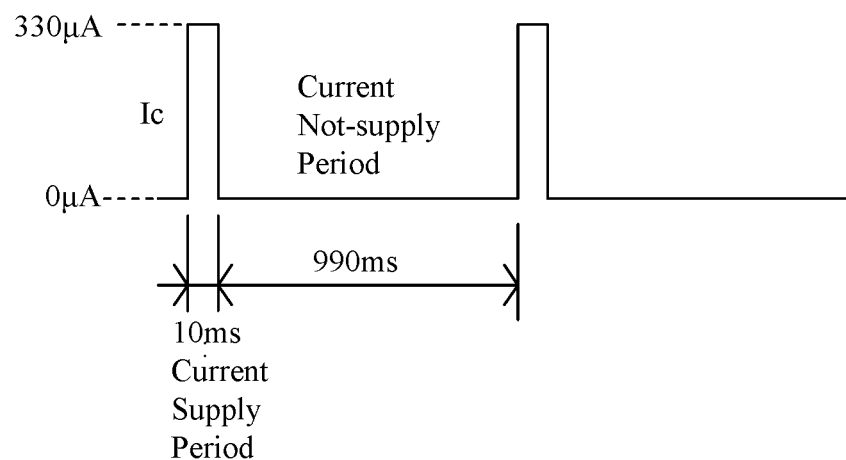

Fig. 6

FOREIGN OBJECT DETECTION METHOD AND POWER SYSTEM CAPABLE OF DETECTING FOREIGN OBJECT

CROSS REFERENCE

The present invention claims priority to U.S. 62/522,943, filed on Jun. 21, 2017, and CN 201810348859.X, filed on Apr. 18, 2018.

BACKGROUND OF THE INVENTION

Field of Invention

The present invention relates to a foreign object detection method and a power system having foreign object detection capability. In particular, the present invention relates to a foreign object detection method and a power system having foreign object detection capability, in which the level of the current supplied from a power supply node of a power supplier side to a power receiver side is adaptively adjusted according to whether a foreign object is detected to exist at the receiver side, such that a rust or damage can be prevented.

Description of Related Art

FIGS. 1A-1C show a prior art power system and possible problems, respectively.

As shown in FIGS. 1A-1C, the prior art power systems 100a, 100b and 100c each includes a power supplier 10, a cable 70 and an electronic device 20. In the prior art power systems 100a, 100b and 100c, the power supplier 10 and the electronic device 20 are coupled to each other through the cable 70. The power supplier 10 at least includes a power converter (not shown), and the electronic device 20 at least includes a load (not shown). The cable 70 includes a positive power transmission line 71, a negative power transmission line 73, and a signal transmission line 72. When the power supplier 10 (power supplier side) and the electronic device 20 (power receiver side) are coupled to each other through the cable 70, the positive power transmission line 71 and the negative power transmission line 73 form a loop and thus are capable of delivering power.

The prior art power systems 100a, 100b and 100c have undesirable errors.

When a foreign object (which may be a solid object such as dust or a liquid object such as moisture) or rust exists in the current loop, such as in the power transmission line or signal transmission line, or between the lines, the equivalent resistance is changed. Hence, the present invention detects whether a foreign object or rust exists, by detecting a change of the equivalent resistance, so that countermeasure can be taken.

When there is a foreign object (or rust; in the following text, rust will be regarded as one form of the foreign object), for example at the connection port of the electronic device 20 for connection with the signal transmission line 72 of the cable 70, it is possible that a resistance is caused to change at the power receiver side, such as at the connection port of the transmission node CCR, or between the transmission lines, which are shown by foreign object resistance Rf and contact resistance Rcont in the figures. When such an abnormal condition occurs, if the power supplier 10 continues supplying high level current to the electronic device 20, the connection port or the transmission line may be damaged by overheat, or an electrolysis reaction may be triggered to rust the connection port or the transmission line; in a severe case it could be dangerous and the electronic device 20 may be severely damaged. FIGS. 1A-1C show different examples of the undesirable errors.

In the power system 100a of FIG. 1A, the foreign object resistance Rf or the contact resistance Rcont is located at a position in series connection with the pull-down resistor Rd. In this case, the connection port of the transmission node CCR may show an abnormally high resistance which is higher than that defined in a transmission interface specification (such as USB PD specification).

In the power system 100b of FIG. 1B, the contact resistance Rcont is located at a position in series connection with the pull-down resistor Rd, and the foreign object resistance Rf is connected to ground. In this case, the connection port of the transmission node CCR may show an abnormally high or abnormally low resistance which is higher or lower than that defined in a transmission interface specification.

In the power system 100c of FIG. 1C, the contact resistance Rcont is located at a position in series connection with the pull-down resistor Rd, and the foreign object resistance Rf is connected to the supply voltage VBUS. In this case, the connection port of the transmission node CCR may show an abnormally high or abnormally low resistance which is higher or lower than that defined in a transmission interface specification.

The abnormal conditions shown in the prior art power systems 100a, 100b and 100c should be properly taken care of; otherwise, heat or rust may be generated to cause danger or damage the electronic device 20.

In view of the above, the present invention provides a foreign object detection method and a power system having foreign object detection capability, in which the level of the current supplied from a power supply node of a power supplier side to a power receiver side is adaptively adjusted according to whether a foreign object is detected to exist at the receiver side, such that a rust or damage can be prevented.

SUMMARY OF THE INVENTION

From one perspective, the present invention provides a foreign object detection method for detecting whether a foreign object exists in a power receiver side in a power delivery loop formed by a power supplier side and the power receiver side, wherein the power supplier side and the power receiver side are configured to be coupled with each other through a cable which includes a positive power transmission line, a negative power transmission line, and a signal transmission line, the power supplier side having a supplier transmission node and the power receiver side having a receiver transmission node, and the signal transmission line transmitting a communication signal between the supplier transmission node and the receiver transmission node, the method comprising: (A) providing a low current to the supplier transmission node, and determining whether a voltage at the supplier transmission node is higher than or equal to a first voltage; (B1) when the step (A) determines that the voltage at the supplier transmission node is higher than or equal to the first voltage, indicating that the power supplier side and the power receiver side are not properly coupled with each other, then, the next step being (B2); (B2) supplying the low current from the supplier transmission node to the power receiver side; (C) when the step (A) determines that the voltage at the supplier transmission node is not higher than and not equal to the first voltage, determining that the power supplier side and the power receiver side are coupled with each other, then, supplying a high current from the supplier transmission node to the power receiver side, wherein the high current is higher than the low current; (D) when the power supplier side and the power receiver side are determined coupled with each other and the high current is supplied from the supplier transmission node to the power receiver side, determining whether the voltage at the supplier transmission node is between a second voltage and a third voltage; (E) when the step (D) determines that the voltage at the supplier transmission node is between the second voltage and the third voltage, which confirms that the power supplier side and the power receiver side are properly coupled with each other, keeping supplying the high current from the supplier transmission node to the power receiver side; (F1) when the step (D) determines that the voltage at the supplier transmission node is not between the second voltage and the third voltage, indicating that a foreign object exists, then, the next step being (F2); and (F2) stopping supplying the high current and changing to supplying the low current from the supplier transmission node to the power receiver side, to avoid damaging or rusting the receiver side.

In one embodiment, the low current in step (F2) is a constant current.

In one embodiment, the low current in step (F2) is a pulsating current.

In one embodiment, the method further comprises: (G) after a foreign object is determined to exist in step (F1) and the low current is supplied from the supplier transmission node to the power receiver side in step (F2), determining for another time whether the voltage at the supplier transmission node is higher than or equal to the first voltage.

When the step (G) determines that the voltage at the supplier transmission node is higher than or equal to the first voltage, indicating that the power supplier side and the power receiver side are not properly coupled with each other, then, the next step is (B2).

When the step (G) determines that the voltage at the supplier transmission node is not higher than and not equal to the first voltage, indicating that a foreign object exists, then, the next step is (F2).

In one embodiment, the method further comprises: (H) when the step (E) confirms that the power supplier side and the power receiver side are properly coupled with each other, and the high current is supplied from the supplier transmission node to the power receiver side, determining whether power delivery communication between the power supplier side and the power receiver side fails.

When the step (H) determines that the power delivery communication between the power supplier side and the power receiver side fails, indicating that a foreign object exists, then, the next step is (F2).

From another perspective, the present invention provides a power system capable of detecting a foreign object, comprising: a power supplier side, which is configured to be coupled to a power receiver side through a cable which includes a positive power transmission line, a negative power transmission line, and a signal transmission line, the power system being adapted to detecting whether a foreign object exists in the power receiver side, the power supplier side having a supplier transmission node and the power receiver side having a receiver transmission node, and the signal transmission line transmitting a communication signal between the supplier transmission node and the receiver transmission node, the power supplier side including: a power converter configured to supply a supply voltage to the power receiver side according to a power supply control signal; a foreign object detection and control circuit configured to generate the power supply control signal for controlling the power converter, and the foreign object detection and control circuit being further configured to generate a foreign object detection and control signal according to a voltage at the supplier transmission node, for determining whether a foreign object exists in the power receiver side; and a pull-up circuit configured to adaptively adjust a level of a supply current which is supplied from the supplier transmission node to the power receiver side.

In one embodiment, the foreign object detection and control circuit includes: a transmission voltage detection circuit configured to detect the voltage at the supplier transmission node to generate a supplier transmission voltage level signal; and an adjustment circuit configured to generate the foreign object detection and control signal according to the supplier transmission voltage level signal.

In one embodiment, the pull-up circuit includes: a pull-up voltage source configured to provide a pull-up voltage; and a pull-up current source coupled to the pull-up voltage source and configured to adaptively adjust the level of the supply current which is supplied from the supplier transmission node to the power receiver side according to the foreign object detection and control signal.

In one embodiment, the pull-up circuit includes: a pull-up voltage source configured to provide a pull-up voltage; and a pull-up resistor coupled to the pull-up voltage source and configured to adaptively adjust the level of the supply current which is supplied from the supplier transmission node to the power receiver side according to the foreign object detection and control signal.

In one embodiment, the foreign object detection and control circuit generates the foreign object detection and control signal according to the voltage at the supplier transmission node by the following steps: (A) providing a low current to the supplier transmission node, and determining whether a voltage at the supplier transmission node is higher than or equal to a first voltage by the transmission voltage detection circuit; (B1) when the step (A) determines that the voltage at the supplier transmission node is higher than or equal to the first voltage, indicating that the power supplier side and the power receiver side are not properly coupled with each other, then, the next step being (B2); (B2) supplying the low current from the supplier transmission node to the power receiver side by the pull-up circuit; (C) when the step (A) determines that the voltage at the supplier transmission node is not higher than and not equal to the first voltage, determining that the power supplier side and the power receiver side are coupled with each other, then, supplying a high current from the supplier transmission node to the power receiver side, wherein the high current is higher than the low current; (D) when the power supplier side and the power receiver side are determined coupled with each other and the pull-up circuit supplies the high current from the supplier transmission node to the power receiver side, determining whether the voltage at the supplier transmission node is between a second voltage and a third voltage, wherein the first voltage is higher than the second voltage, the second voltage is higher than the third voltage, and the third voltage is higher than 0; (E) when the step (D) determines that the voltage at the supplier transmission node is between the second voltage and the third voltage, which confirms that the power supplier side and the power receiver side are properly coupled with each other, keeping supplying the high current from the supplier transmission node to the power receiver side by the pull-up circuit; (F1) when the step (D) determines that the voltage at the supplier transmission node is not between the second voltage and the third voltage, indicating that a foreign object exists, then, the next step being (F2); and (F2) stopping supplying the high current and changing to supplying the low current from the supplier transmission node to the power receiver side by the pull-up circuit, to avoid damaging or rusting the receiver side.

In one embodiment, the low current in step (F2) is a pulsating current.

In one embodiment, the low current in step (F2) is a pulsating current.

In one embodiment, after a foreign object is determined to exist in step (F1) and the low current is supplied from the supplier transmission node to the power receiver side in step (F2), the transmission voltage detection circuit further: (G) determines for another time whether the voltage at the supplier transmission node is higher than or equal to the first voltage.

In one embodiment, when the transmission voltage detection circuit determines in step (G) that the voltage at the supplier transmission node is higher than or equal to the first voltage, indicating that the power supplier side and the power receiver side are not properly coupled with each other, then, the next step is (B2).

In one embodiment, when the transmission voltage detection circuit determines in step (G) that the voltage at the supplier transmission node is not higher than and not equal to the first voltage, indicating that a foreign object exists, then, the next step is (F2).

In one embodiment, when the step (E) confirms that the power supplier side and the power receiver side are properly coupled with each other, and the high current is supplied from the supplier transmission node to the power receiver side, (H) the foreign object detection and control circuit further determines whether power delivery communication between the power supplier side and the power receiver side fails.

In one embodiment, when the step (H) determines that the power delivery communication between the power supplier side and the power receiver side fails, indicating that a foreign object exists, then, the next step is (F2).

From another perspective, the present invention provides a foreign object detection method for detecting whether a foreign object exists in a power receiver side in a power delivery loop formed by a power supplier side and the power receiver side, wherein the power supplier side and the power receiver side are configured to be coupled with each other through a cable which includes a positive power transmission line, a negative power transmission line, and a signal transmission line, the power supplier side having a supplier transmission node and the power receiver side having a receiver transmission node, and the signal transmission line transmitting a communication signal between the supplier transmission node and the receiver transmission node, the method comprising: providing a low current to the supplier transmission node; and determining whether the power receiver side is coupled to the power supplier side and whether a foreign object exists, and when the power receiver side is coupled to the power supplier side and no foreign object exists, changing to supplying a high current through the supplier transmission node; otherwise keeping supplying the low current to the supplier transmission node.

In one embodiment, the step of determining whether the power receiver side is coupled to the power supplier side and whether a foreign object exists includes: determining whether a voltage at the supplier transmission node is within a voltage range; when the voltage at the supplier transmission node is within the voltage range, concluding that the power receiver side is coupled to the power supplier side and no foreign object exists; and when the voltage at the supplier transmission node is not within the voltage range, concluding that the power receiver side is not coupled to the power supplier side or a foreign object exists.

The objectives, technical details, features, and effects of the present invention will be better understood with regard to the detailed description of the embodiments below.

BRIEF DESCRIPTION OF THE DRAWINGS

FIG. 5A shows an example of the first, second and third voltages.

FIG. 5B shows a more specific example of the first, second and third voltages.

FIG. 6 shows an example of a pulsating current according to the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2A:
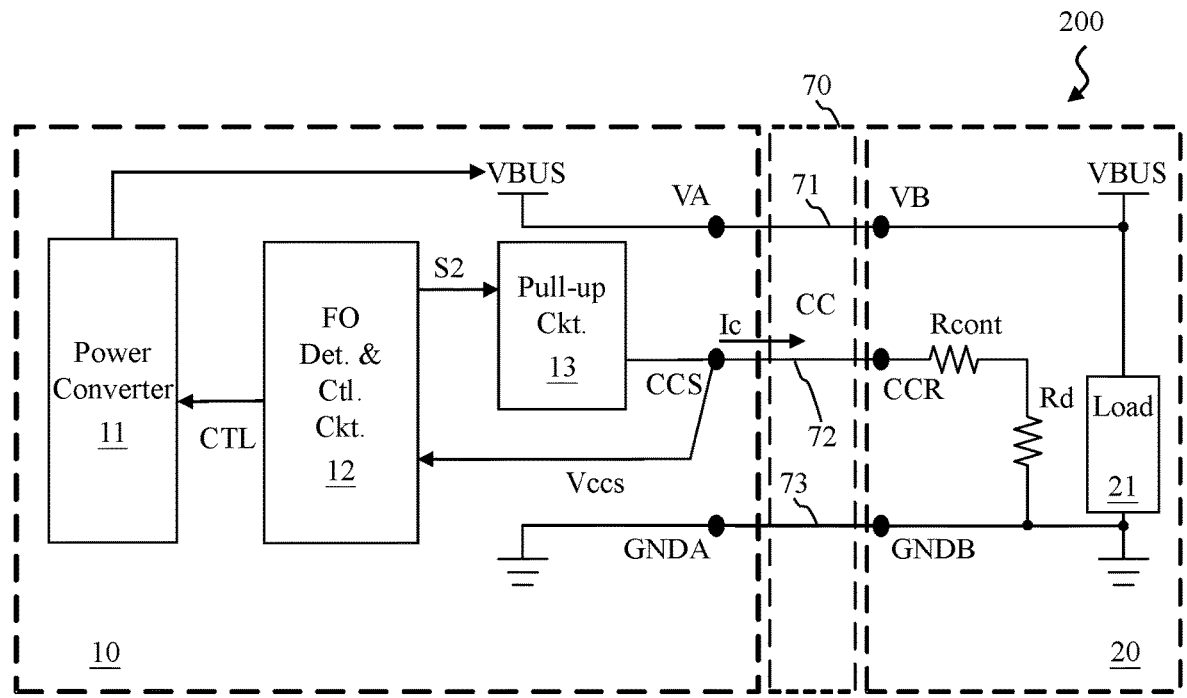
FIG. 2A shows an embodiment of a power system capable of detecting the existence of a foreign object according to the present invention.
Figure 4:
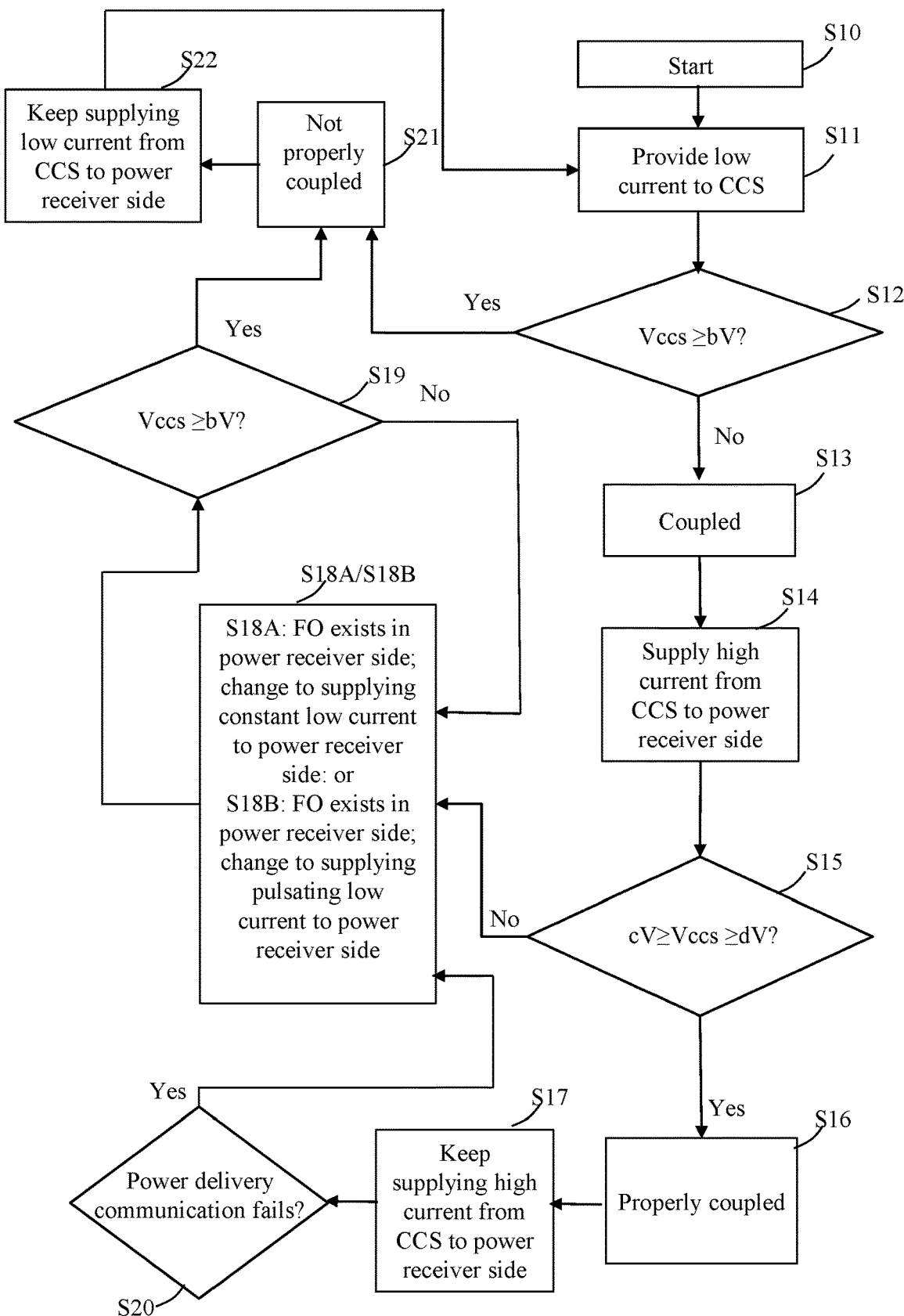
FIG. 4 shows a process flow of an embodiment of a foreign object detection method according to the present invention.

Please refer to FIG. 2A in conjunction with FIG. 4. FIG. 2A shows an embodiment of a power system capable of detecting the existence of a foreign object according to the present invention; FIG. 4 shows a process flow of an embodiment of a foreign object detection method according to the present invention.

As shown in FIG. 2A, in this embodiment, the foreign object detection method according to the present invention can be used in a power system 200 such that the power system is capable of detecting a foreign object. The power system 200 includes a power supplier side 10, a cable 70 and a power receiver side 20, wherein the power supplier side 10 and the power receiver side 20 are configured to be coupled with each other through the cable 70 to form a power delivery loop for transmitting power. In this embodiment, the cable 70 includes a positive power transmission line 71, a negative power transmission line 73, and a signal transmission line 72. The power supplier side 10 having a supplier transmission node CCS and the power receiver side having a receiver transmission node CCR, and the signal transmission line 72 transmits a communication signal CC between the supplier transmission node CCS and the receiver transmission node CCR.

In one embodiment, the power system 200 for example can be a power system which complies with a USB PD (Universal Serial Bus Power Delivery) specification, and the supplier transmission node CCS, the receiver transmission node CCR and the communication signal CC correspond to the configuration channel and configuration channel signal in USB PD specification. However, the present invention is not limited to this application.

The present invention can detect whether a foreign object exists in the power receiver side 20 (to be explained in detail with reference to FIG. 4). When a foreign object exists in the power receiver side 20, in one embodiment, the power system 200 can adaptively lower the level of a supply current Ic which is supplied from the supplier transmission node CCS to the power receiver side 20. In another embodiment, when it is detected that a foreign object exists in the power receiver side 20, the power system 200 can issue an alarm, or can stop transmitting power to the power receiver side 20 from the power supplier side 10; certainly, in normal condition when there is no foreign object, the power system 200 can transmit power to the power receiver side 20 from the power supplier side 10.

As shown in FIG. 2A, in one embodiment, the power supplier side 10 is for example but not limited to a power supply, and the power receiver side 20 is for example but not limited to an electronic device. The power supply includes a power converter 11, a foreign object detection and control circuit (FO Det. & Ctl. Ckt.) 12, and a pull-up circuit (Pull-up Ckt.) 13.

The power converter 11 supplies a supply voltage VBUD to the power receiver side 20 according to a power supply control signal CTL. The power converter 11 for example can be any kind of switching power regulator, and the present invention is not limited to any specific type thereof.

The foreign object detection and control circuit 12, on the one hand, generates the power supply control signal CTL for controlling the power converter 11, and on the other hand, the foreign object detection and control circuit also generates a foreign object detection and control signal S2 according to a voltage Vccs at the supplier transmission node CCS, for determining whether a foreign object exists in the power receiver side 20 (to be explained in detail with reference to FIG. 4).

The pull-up circuit 13 adaptively adjusts the level of the supply current Ic which is supplied from the supplier transmission node CCS to the power receiver side 20 (to be explained in detail with reference to FIG. 4).

Figure 2B:
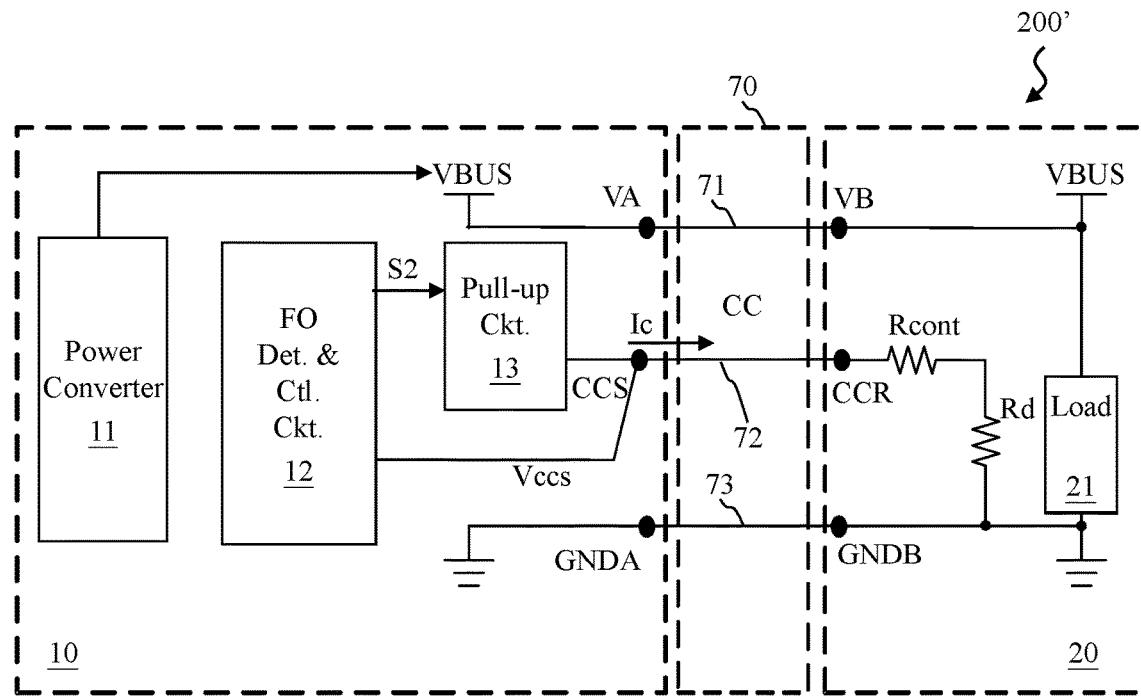
FIG. 2B shows another embodiment of a power system capable of detecting the existence of a foreign object according to the present invention.

Please refer to FIG. 2B which shows another embodiment of a power system capable of detecting foreign object according to the present invention. In this embodiment, the foreign object detection and control circuit 12 does not control the power converter 11.

Figure 3A:
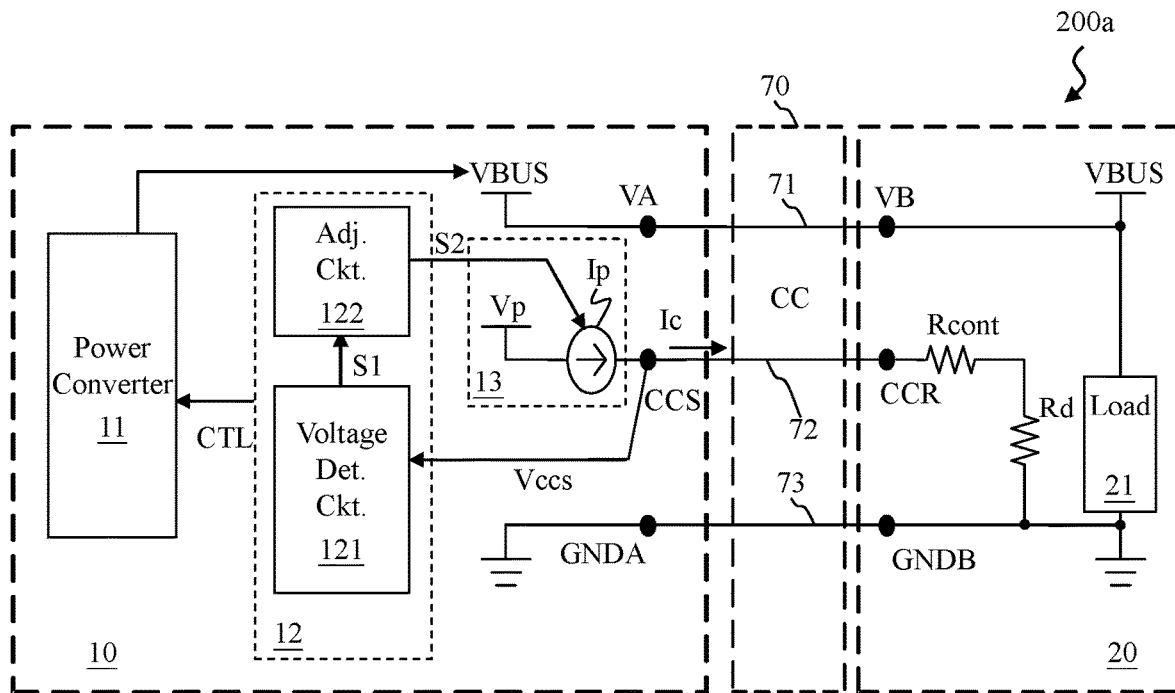
FIG. 3A shows an embodiment of a foreign object detection and control circuit according to the present invention and an embodiment of a pull-up circuit according to the present invention.

Please refer to FIG. 3A in conjunction with FIG. 2A. FIG. 3A shows a more specific embodiment of a foreign object detection and control circuit and a pull-up circuit therein, according to the present invention.

As shown in FIG. 3A, the foreign object detection and control circuit 12 includes a transmission voltage detection circuit (Voltage Det. Ckt.) 121 and an adjustment circuit (Adj. Ckt.) 122. The transmission voltage detection circuit 121 is configured to detect the voltage Vccs at the supplier transmission node CCS, and generate a supplier transmission voltage level signal S1. The adjustment circuit 122 is configured to generate the foreign object detection and control signal S2 according to the supplier transmission voltage level signal S1.

As shown in FIG. 3A, in one embodiment, the pull-up circuit 13 includes a pull-up voltage source Vp and a pull-up current source Ip. The pull-up voltage source Vp provides a pull-up voltage. The pull-up current source Ip adaptively adjusts the level of the supply current Ic supplied from the supplier transmission node CCS to the power receiver side 20 according to the foreign object detection and control signal S2.

Figure 3B:
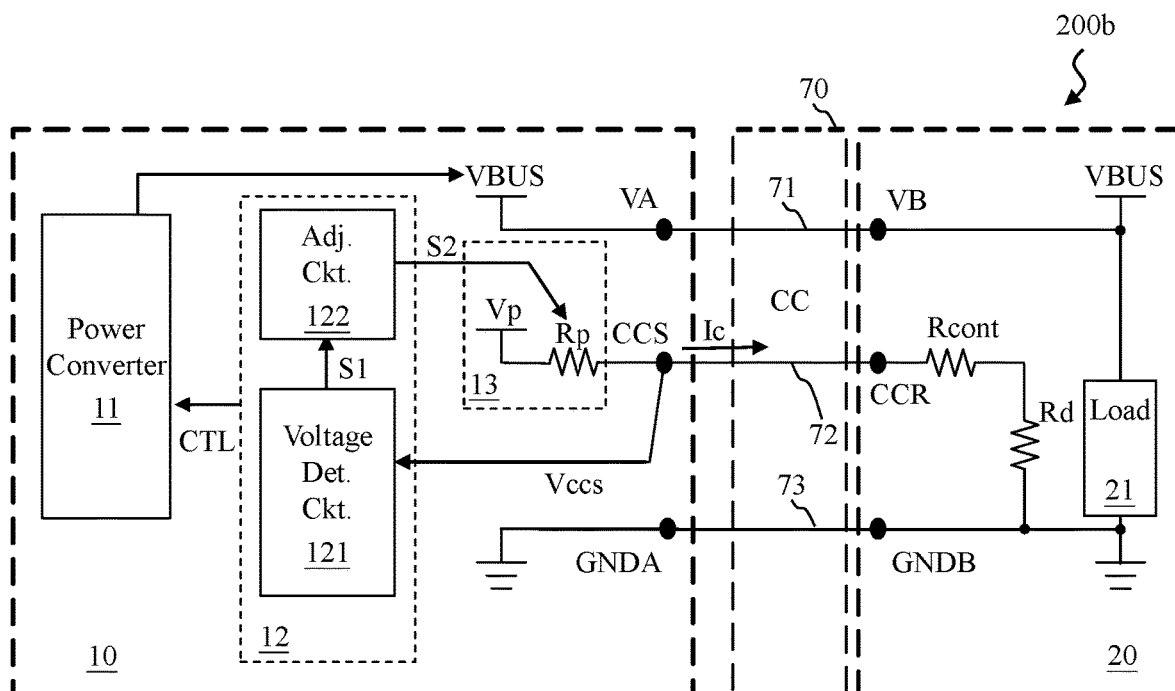
FIG. 3B shows another embodiment of a foreign object detection and control circuit according to the present invention and another embodiment of a pull-up circuit according to the present invention.

Referring to FIG. 3B, in another embodiment, the pull-up circuit 13 includes a pull-up voltage source Vp and a pull-up resistor Rp. The pull-up voltage source Vp provides a pull-up voltage. The pull-up Resistor Rp adaptively adjusts the level of the supply current Ic supplied from the supplier transmission node CCS to the power receiver side 20 according to the foreign object detection and control signal S2; this can be achieved by adjusting the resistance of the pull-up Resistor Rp.

In these embodiments, the power receiver side 20 is an electronic device which includes a load 21. When power supplier side 10 and the electronic device (power receiver side 20) are coupled to each other through the cable 70, the positive power transmission line 71 and the negative power transmission line 73 form a loop and thus are capable of delivering power, that is, the power converter 11 in the power supplier side 10 supplies the supply voltage VBUS to the load 21 in the power receiver side 20.

How the foreign object detection and control circuit 12 generates the foreign object detection and control signal S2 according to the voltage Vccs at the supplier transmission node CCS to determine whether a foreign object exists in the power receiver side 20, is now explained below.

Please refer to FIG. 4 in conjunction with FIGS. 2A, 5A and 5B. FIG. 5A shows an embodiment of the first, second and third voltages according to the present invention. FIG. 5B shows a more specific embodiment of the first, second and third voltages according to the present invention.

As shown by step S11 in FIG. 4, first, the power supplier side 10 provides a low current to the supplier transmission node CCS (in one embodiment, the low current for example can be provided by the pull-up current source Ip in FIG. 3A). The transmission voltage detection circuit 121 in the foreign object detection and control circuit 12 determines whether the voltage Vccs at the supplier transmission node CCS is higher than or equal to a first voltage (step S12). In one embodiment, the first voltage is for example bV shown in FIG. 5A. As a more specific example, the first voltage for example is 4V shown in FIG. 5B. In this embodiment, the transmission voltage detection circuit 121 in the foreign object detection and control circuit 12 determines whether the voltage Vccs at the supplier transmission node CCS is higher than or equal to the first voltage (e.g. bV in FIG. 5A, or 4V in FIG. 5B). Note that 4V is only an example, and the number can be set different as required.

If the result of step S12 is yes, indicating that the power supplier side 10 and the power receiver side 20 are not properly coupled with each other (step S21), the pull-up circuit 13 supplies a low current (i.e. the supply current Ic) from the supplier transmission node CCS to the power receiver side 20 (step S22). In one embodiment, the supply current Ic is for example 1 μA. However, this number of low current is given only as an example; the level of the supply current Ic can be any number as required. In addition, "not properly coupled" means that the transmission voltage detection circuit 121 in the foreign object detection and control circuit 12 determines, according to the voltage Vccs at the supplier transmission node CCS, that the power supplier side 10 and the power receiver side 20 are disconnected from each other or there is a very large resistance (e.g. 4 MΩ) in between.

When the result of step S12 is no, it is determined that the power supplier side 10 and the power receiver side 20 are coupled with each other (step S13), then, the pull-up circuit 13 supplies a high current (i.e. the supply current Ic) from the supplier transmission node CCS to the power receiver side 20 (step S14). In one embodiment, the supply current Ic is for example 330 µA. The high current is higher than the low current (e.g., 330 µA>1 µA). However, this number of high currency is given only as an example; the level of the supply current Ic can be any number as required. In this embodiment, 330 µA corresponds to the current specification in the USB PD for the CC pin. In other embodiments, the level of the supply current Ic can be other numbers such as 180 µA or 80 µA, and certainly the number can be selected to meet other specifications.

When the power supplier side 10 and the power receiver side 20 are determined coupled with each other and the high current (i.e. the supply current Ic, e.g. 330 µA) is supplied from the supplier transmission node CCS to the power receiver side 20, the transmission voltage detection circuit 121 in the foreign object detection and control circuit 12 determines whether the voltage Vccs at the supplier transmission node CCS is between a second voltage and a third voltage (step S15).

In one embodiment, the second voltage is for example cV in FIG. 5A; in a more specific embodiment, the second voltage is 2.6V in FIG. 5B. In one embodiment, the third voltage is for example dV in FIG. 5A; in a more specific embodiment, the third voltage is 0.8V in FIG. 5B. That is, for example, the transmission voltage detection circuit 121 in the foreign object detection and control circuit 12 determines whether the voltage Vccs at the supplier transmission node CCS is between 0.8V and 2.6V, i.e., cV≥Vccs≥dV, more specifically 2.6V≥Vccs≥0.8V. Note that these numbers are only examples, and the numbers can be set different as required. Note that the first voltage is higher than the second voltage; the second voltage is higher than the third voltage; and the third voltage is higher than 0V.

When the result of step S15 is yes, (e.g. when 2.6V≥Vccs≥0.8V), it is confirmed that the power supplier side 10 and the power receiver side 20 are properly coupled with each other (step S16), the pull-up circuit 13 keeps supplying the high current (i.e. the supply current Ic, e.g. 330 µA) from the supplier transmission node CCS to the power receiver side 20 (step S17).

Note that the range 0.8V~2.6V can be modified as required. In other embodiments, the range can be set to correspond to other thresholds defined in the USB PD specification for the CC pin, such as 0.4V~1.6V (i.e., the second voltage is 1.6V and the third voltage is 0.4V) or 0.2V~1.6V (i.e., the second voltage is 1.6V and the third voltage is 0.2V). Certainly, the numbers can be set to correspond to other specifications.

When the result of step s15 is no, that is, when the voltage Vccs is between 0.8V and 0V or between 4V and 2.6V, it indicates that a foreign object exists in the power receiver side 20; hence, the pull-up circuit 13 changes to supplying the low current from the supplier transmission node CCS to the power receiver side 20 (step S18A or S18B), to avoid damaging or rusting the power receiver side 20. For example, the level of the supply current Ic is reduced from 330 µA to 1 µA.

Note that there are at least two ways to embody "changing to supplying the low current". In one embodiment, the level of the supply current Ic is reduced from 330 µA to 1 µA by adjusting the current provided by the pull-up current source Ip (FIG. 3A); in another embodiment, the level of the supply current Ic is reduced from 330 µA to 1 µA by adjusting the resistance of the pull-up resistor Rp (FIG. 3B).

Figure 1A:
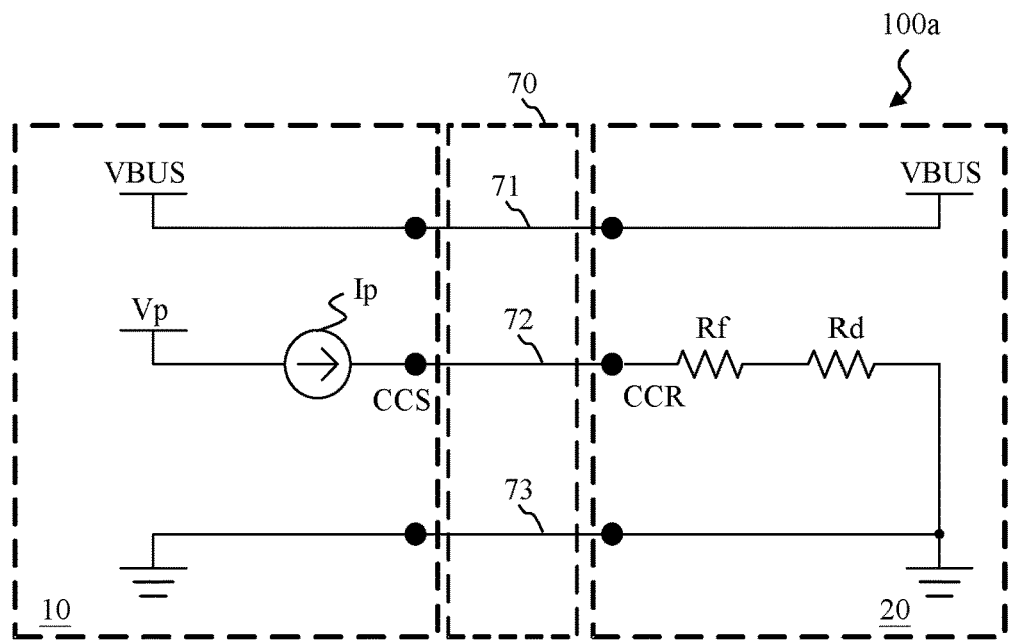
FIGS. 1A-1C show prior art power systems with possible problems.
Figure 1B:
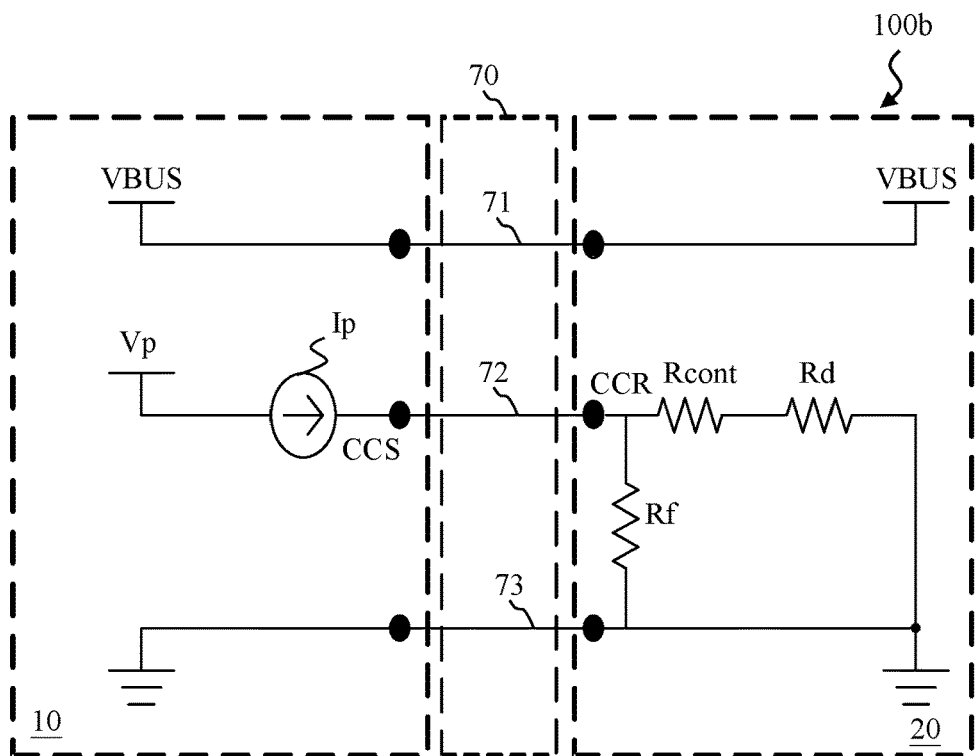
Figure 1C:
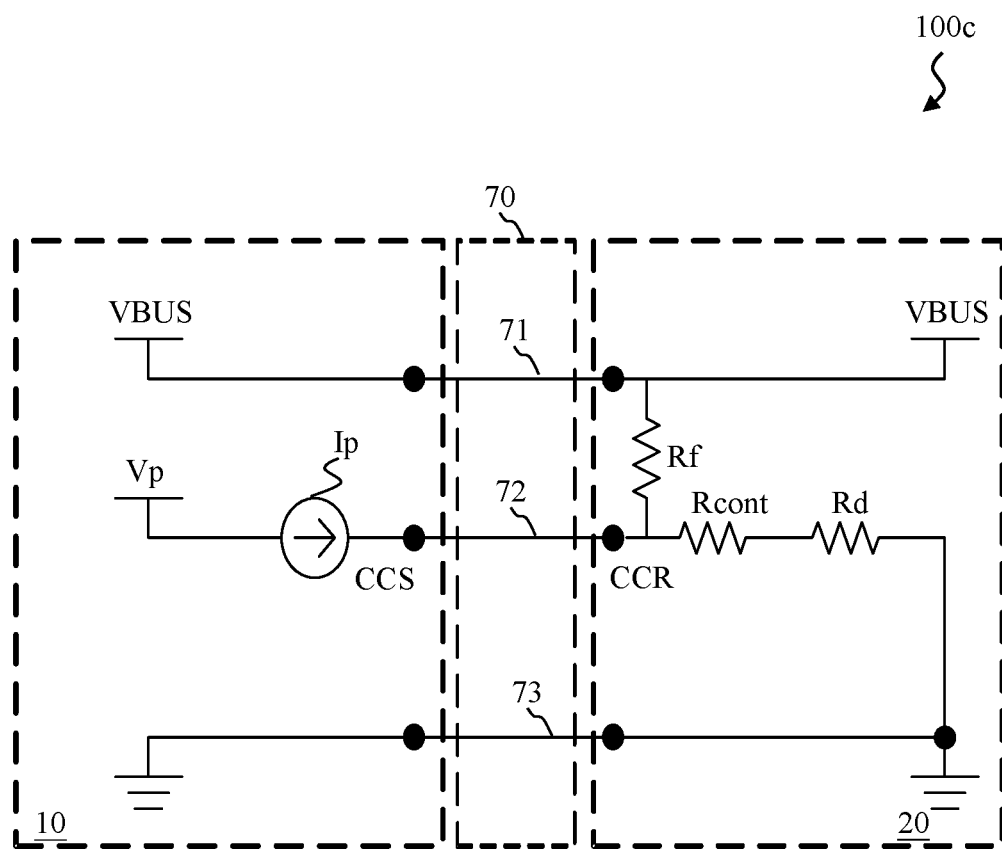

The present invention can detect whether a foreign object exists in the power receiver side 20. In the example given above, when the voltage Vccs is between 0.8V and 0V or between 4V and 2.6V, it indicates that a foreign object exists in the power receiver side 20. Under such circumstance, according to the present invention, the pull-up circuit 13 changes to supplying the low current from the supplier transmission node CCS to the power receiver side 20, i.e., the supply current Ic is reduced by one or more order, to effectively avoid damaging or rusting the power receiver side 20. In one embodiment, when the voltage Vccs is between 0.8V and 0V, it corresponds to the error condition of FIG. 1C, and when the voltage Vccs is between 4V and 2.6V, it corresponds to the error condition of FIG. 1A or 1B.

In one embodiment, the low current is a constant current such as 1 µA (step S18A).

In another embodiment, referring to FIG. 6, the low current can be a pulsating current (step S18B). As shown in FIG. 6, the supply current Ic supplied by the pull-up circuit 13 from the supplier transmission node CCS to the power receiver side 20 can last for only 10 ms, and stop for 990 ms, as one cycle period. In this case, the total charges or the average current supplied by the pull-up circuit 13 from the supplier transmission node CCS to the power receiver side 20 is lower than the high current 330 µA, and this is also capable of effectively avoiding damaging or rusting the power receiver side 20.

In one embodiment, after the pull-up circuit 13 changes to supplying the low current (such as from 330 µA to 1 µA) from the supplier transmission node CCS to the power receiver side 20, the transmission voltage detection circuit 121 in the foreign object detection and control circuit 12 determines for another time whether the voltage Vccs at the supplier transmission node CCS is higher than or equal to the first voltage (e.g. bV in FIG. 5A, or 4V in FIG. 5B) (step S19). That is, the voltage Vccs is compared with the first voltage again.

In one embodiment, the low current as shown by step S11 and step S22 in FIG. 4 can be a constant current such as 1 µA, which is similar to the low current as shown by step S18A in FIG. 4.

In another embodiment, the low current as shown by step S11 and step S22 in FIG. 4 can be a pulsating current, which is similar to the low current as shown by step S18B in FIG. 4.

When the result of step S19 is yes, indicating that the power supplier side 10 and the power receiver side 20 are not properly coupled with each other (step S21), the pull-up circuit 13 keeps supplying the low current from the supplier transmission node CCS to the power receiver side 20 (step S22).

Although it has been determined that the power supplier side and the power receiver side 20 are coupled with each other (step S13), when a foreign object exists in the power receiver side 20, step S19 can further check again whether the power supplier side and the power receiver side 20 are properly coupled with each other. If the result of step S19 is yes, it indicates that the power supplier side 10 and the power receiver side 20 are not properly coupled with each other; it is possible that they are previously coupled with each other but not now.

When the result of step S19 is no, a foreign object still exists in the power receiver side 20, and the process goes back to step S18A or S18B; the pull-up circuit 13 keeps supplying the low current from the supplier transmission node CCS to the power receiver side 20. The level of the supply current Ic is for example 1 μA as mentioned above.

In one embodiment, when it has been determined that the power supplier side 10 and the power receiver side 20 are properly coupled with each other (step S16, such as when the voltage Vccs is between 2.6V and 0.8V in FIG. 5B), and the pull-up circuit 13 keeps supplying the high current from the supplier transmission node CCS to the power receiver side 20 (step S17), the power system 200 according to the present invention can further checks whether power delivery communication between the power supplier side 10 and the power receiver side 20 fails (step S20). The "power delivery communication" for example can be the communication between the power supplier side 10 and the power receiver side 20 in compliant with a protocol defined in a specification such as the USB PD specification, whereby the power supplier side 10 can supply requested voltage and/or current to the power receiver side 20.

When the result of step S20 is yes, for example because a foreign object exists in the power receiver side 20, in one embodiment, the power system 200 returns to the step S18A or S18B, and the pull-up circuit 13 changes to supplying the low current from the supplier transmission node CCS to the power receiver side 20, to avoid damaging or rusting the power receiver side 20.

"Changing to supplying the low current" for example can be, as mentioned earlier, changing the level of the supply current Ic from 330 μA to 1 μA.

The step S20 provides a safety check. When the voltage Vccs is between the second voltage and the third voltage (such as between 2.6V and 0.8V), it generally indicates that no foreign object exists in the power receiver side 20. However, this could be false positive, for example, when there are many foreign objects and the resistances of these foreign objects happen to cause the voltage Vccs to be between the second voltage and the third voltage. By checking whether the power delivery communication fails, such error conditions can be found.

Thus, by step S20, it can be double confirmed that there is indeed no foreign object existing in the power receiver side 20. When the result of step S20 is yes, i.e., the power delivery communication between the power supplier side 10 and the power receiver side 20 fails, in one embodiment, the power system 200 returns to the step S18A or S18B, and the pull-up circuit 13 changes to supplying the low current from the supplier transmission node CCS to the power receiver side 20, to avoid damaging or rusting the power receiver side 20.

Referring to FIG. 2A, in one embodiment, when it is determined that a foreign object exists in the power receiver side 20, the foreign object detection and control circuit 12 controls the power converter 11 to stop outputting the supply voltage VBUS, to prevent the transmission interface from receiving a high current to cause any damage.

From one perspective, the foreign object detection method according to the present invention can be summarized as the following steps: providing a low current to the supplier transmission node CCS, such as 1 μA; and determining whether the power receiver side 20 is coupled to the power supplier side 10 and whether a foreign object exists, and when the power receiver side 20 is coupled to the power supplier side 10 and no foreign object exists, changing to supplying a high current (such as 330 μA) through the supplier transmission node CCS; otherwise keeping supplying the low current to the supplier transmission node CCS. In one embodiment, the step of determining whether the power receiver side 20 is coupled to the power supplier side 10 and whether a foreign object exists includes: determining whether the voltage Vccs at the supplier transmission node CCS is within a voltage range (such as between cV and dV); when the voltage Vccs at the supplier transmission node CCS is within the voltage range, concluding that the power receiver side 20 is coupled to the power supplier side 10 and no foreign object exists; and when the voltage Vccs at the supplier transmission node CCS is not within the voltage range, concluding that the power receiver side 20 is not coupled to the power supplier side 10 or a foreign object exists.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. As an example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A foreign object detection method for detecting whether a foreign object exists in a power receiver side in a power delivery loop formed by a power supplier side and the power receiver side, wherein the power supplier side and the power receiver side are configured to be coupled with each other through a cable which includes a positive power transmission line, a negative power transmission line, and a signal transmission line, the power supplier side having a supplier transmission node and the power receiver side having a receiver transmission node, and the signal transmission line transmitting a communication signal between the supplier transmission node and the receiver transmission node, the method comprising:

(A) providing a low current to the supplier transmission node, and determining whether a voltage at the supplier transmission node is higher than or equal to a first voltage;

(B1) when the step (A) determines that the voltage at the supplier transmission node is higher than or equal to the first voltage, indicating that the power supplier side and the power receiver side are not properly coupled with each other, then, the next step being (B2);

(B2) supplying the low current from the supplier transmission node to the power receiver side;

(C) when the step (A) determines that the voltage at the supplier transmission node is not higher than and not equal to the first voltage, determining that the power supplier side and the power receiver side are coupled with each other, then, supplying a high current from the supplier transmission node to the power receiver side, wherein the high current is higher than the low current;

(D) when the power supplier side and the power receiver side are determined coupled with each other and the high current is supplied from the supplier transmission node to the power receiver side, determining whether the voltage at the supplier transmission node is between a second voltage and a third voltage;

(E) when the step (D) determines that the voltage at the supplier transmission node is between the second voltage and the third voltage, which confirms that the power supplier side and the power receiver side are properly coupled with each other, keeping supplying the high current from the supplier transmission node to the power receiver side;

(F1) when the step (D) determines that the voltage at the supplier transmission node is not between the second voltage and the third voltage, indicating that a foreign object exists, then, the next step being (F2); and (F2) stopping supplying the high current and changing to supplying the low current from the supplier transmission node to the power receiver side, to avoid damaging or rusting the receiver side.

2. The foreign object detection method of claim 1, wherein the low current is a constant current, and wherein a level of the constant current is lower than a level of the high current.

3. The foreign object detection method of claim 1, wherein the low current is a pulsating current, and wherein an average level of the pulsating current is lower than a level of the high current.

4. The foreign object detection method of claim 1, further comprising: after a foreign object is determined to exist in step (F1) and the low current is supplied from the supplier transmission node to the power receiver side in step (F2), (G) determining for another time whether the voltage at the supplier transmission node is higher than or equal to the first voltage.

5. The foreign object detection method of claim 4, wherein when the step (G) determines that the voltage at the supplier transmission node is higher than or equal to the first voltage, indicating that the power supplier side and the power receiver side are not properly coupled with each other, then, the next step being (B2).

6. The foreign object detection method of claim 4, wherein when the step (G) determines that the voltage at the supplier transmission node is not higher than and not equal to the first voltage, indicating that a foreign object exists, then, the next step being (F2).

7. The foreign object detection method of claim 1, further comprising: when the step (E) confirms that the power supplier side and the power receiver side are properly coupled with each other, and the high current is supplied from the supplier transmission node to the power receiver side, (H) determining whether power delivery communication between the power supplier side and the power receiver side fails.

8. The foreign object detection method of claim 7, wherein when the step (H) determines that the power delivery communication between the power supplier side and the power receiver side fails, indicating that a foreign object exists, then, the next step being (F2).

9. A power system capable of detecting a foreign object, comprising:

a power supplier side, which is configured to be coupled to a power receiver side through a cable which includes a positive power transmission line, a negative power transmission line, and a signal transmission line the power system being adapted to detecting whether a foreign object exists in the power receiver side, the power supplier side having a supplier transmission node and the power receiver side having a receiver transmission node, and the signal transmission line transmitting a communication signal between the supplier transmission node and the receiver transmission node the power supplier side including:

a power converter configured to supply a supply voltage to the power receiver side according to a power supply control signal;

a foreign object detection and control circuit configured to generate the power supply control signal for controlling the power converter, and the foreign object detection and control circuit being further configured to generate a foreign object detection and control signal according to a voltage at the supplier transmission node, for determining whether a foreign object exists in the power receiver side; and a pull-up circuit configured to adaptively adjust a level of a supply current which is supplied from the supplier transmission node to the power receiver side wherein the foreign object detection and control circuit generates the foreign object detection and control signal according to the voltage at the supplier transmission node by the following steps:

(A) providing a low current to the supplier transmission node, and determining whether a voltage at the supplier transmission node is higher than or equal to a first voltage by the transmission voltage detection circuit, wherein the low current corresponds to a low level of the supply current;

(B1) when the step (A) determines that the voltage at the supplier transmission node is higher than or equal to the first voltage, indicating that the power supplier side and the power receiver side are not properly coupled with each other, then, the next step being (B2);

(B2) supplying the low current from the supplier transmission node to the power receiver side by the pull-up circuit;

(C) when the step (A) determines that the voltage at the supplier transmission node is not higher than and not equal to the first voltage, determining that the power supplier side and the power receiver side are coupled with each other, then, supplying a high current from the supplier transmission node to the power receiver side, wherein the high current corresponds to a high level of the supply current, wherein the high current is higher than the low current;

(D) when the power supplier side and the power receiver side are determined coupled with each other and the pull-up circuit supplies the high current from the supplier transmission node to the power receiver side, determining whether the voltage at the supplier transmission node is between a second voltage and a third voltage, wherein the first voltage is higher than the second voltage, the second voltage is higher than the third voltage, and the third voltage is higher than 0;

(E) when the step (D) determines that the voltage at the supplier transmission node is between the second voltage and the third voltage, which confirms that the power supplier side and the power receiver side are properly coupled with each other, keeping supplying the high current from the supplier transmission node to the power receiver side by the pull-up circuit;

(F1) when the step (D) determines that the voltage at the supplier transmission node is not between the second voltage and the third voltage, indicating that a foreign object exists, then, the next step being (F2); and (F2) stopping supplying the high current and changing to supplying the low current from the supplier transmission node to the power receiver side by the pull-up circuit, to avoid damaging or rusting the receiver side.

10. The power system of claim 9, wherein the foreign object detection and control circuit includes:
a transmission voltage detection circuit configured to detect the voltage at the supplier transmission node to generate a supplier transmission voltage level signal; and
an adjustment circuit configured to generate the foreign object detection and control signal according to the supplier transmission voltage level signal.

11. The power system of claim 9, wherein the pull-up circuit includes:
a pull-up voltage source configured to provide a pull-up voltage; and
a pull-up current source coupled to the pull-up voltage source and configured to adaptively adjust the level of the supply current which is supplied from the supplier transmission node to the power receiver side according to the foreign object detection and control signal.

12. The power system of claim 9, wherein the pull-up circuit includes:
a pull-up voltage source configured to provide a pull-up voltage; and
a pull-up resistor coupled to the pull-up voltage source and configured to adaptively adjust the level of the supply current which is supplied from the supplier transmission node to the power receiver side according to the foreign object detection and control signal.

13. The power system of claim 9, wherein the low current is a constant current, and wherein a level of the constant current is lower than a level of the high current.

14. The power system of claim 9, wherein the low current is a pulsating current, and wherein an average level of the pulsating current is lower than a level of the high current.

15. The power system of claim 9, wherein after a foreign object is determined to exist in step (F1) and the low current is supplied from the supplier transmission node to the power receiver side in step (F2), the transmission voltage detection circuit further:
(G) determines for another time whether the voltage at the supplier transmission node is higher than or equal to the first voltage.

16. The power system of claim 15, wherein when the transmission voltage detection circuit determines in step (G) that the voltage at the supplier transmission node is higher than or equal to the first voltage, indicating that the power supplier side and the power receiver side are not properly coupled with each other, then, the next step is (B2).

17. The power system of claim 15, wherein when the transmission voltage detection circuit determines in step (G) that the voltage at the supplier transmission node is not higher than and not equal to the first voltage, indicating that a foreign object exists, then, the next step is (F2).

18. The power system of claim 9, wherein when the step (E) confirms that the power supplier side and the power receiver side are properly coupled with each other, and the high current is supplied from the supplier transmission node to the power receiver side,
(H) the foreign object detection and control circuit further determines whether power delivery communication between the power supplier side and the power receiver side fans.

19. The power system of claim 18, wherein when the step (H) determines that the power delivery communication between the power supplier side and the power receiver side fails, indicating that a foreign object exists, then, the next step is (F2).

20. A foreign object detection method for detecting whether a foreign object exists in a power receiver side in a power delivery loop formed by a power supplier side and the power receiver side, wherein the power supplier side and the power receiver side are configured to be coupled with each other through a cable which includes a positive power transmission line, a negative power transmission line, and a signal transmission line the power supplier side having a supplier transmission node and the power receiver side having a receiver transmission node, and the signal transmission line transmitting a communication signal between the supplier transmission node and the receiver transmission node, the method comprising:
providing a low current to the supplier transmission node; and
determining whether the power receiver side is coupled to the power supplier side and whether a foreign object exists, and when the power receiver side is coupled to the power supplier side and no foreign object exists, changing to supplying a high current through the supplier transmission node, wherein the high current is higher than the low current;
otherwise keeping supplying the low current to the supplier transmission node;
wherein the step of determining whether the power receiver side is coupled to the power supplier side and whether a foreign object exists includes:
(A) after providing the low current to the supplier transmission node, determining whether the voltage at the supplier transmission node is higher than or equal to a first voltage;
(B1) when the step (A) determines that the voltage at the supplier transmission node is higher than or equal to the first voltage, indicating that the power supplier side and the power receiver side are not properly coupled with each other, then, the next step being (B2);
(B2) supplying the low current from the supplier transmission node to the power receiver side;
(C) when the step (A) determines that the voltage at the supplier transmission node is not higher than and not equal to the first voltage, determining that the power supplier side and the power receiver side are coupled with each other, then, supplying a high current from the supplier transmission node to the power receiver side, wherein the high current is higher than the low current;

(D) when the power supplier side and the power receiver side are determined coupled with each other and the pull-up circuit supplies the high current from the supplier transmission node to the power receiver side, determining whether the voltage at the supplier transmission node is between a second voltage and a third voltage, wherein the first voltage is higher than the second voltage, the second voltage is higher than the third voltage, and the third voltage is higher than 0;

(E) when the step (D) determines that the voltage at the supplier transmission node is between the second voltage and the third voltage, which confirms that the power supplier side and the power receiver side are properly coupled with each other, keeping supplying the high current from the supplier transmission node to the power receiver side;

(F1) when the step (D) determines that the voltage at the supplier transmission node is not between the second voltage and the third voltage, indicating that a foreign object exists, then, the next step being (F2); and (F2) stopping supplying the high current and changing to supplying the low current from the supplier transmission node to the power receiver side, to avoid damaging or rusting the receiver side.

21. The foreign object detection method of claim 20, wherein the step of determining whether the power receiver side is coupled to the power supplier side and whether a foreign object exists includes:

determining whether a voltage at the supplier transmission node is within a voltage range;

when the voltage at the supplier transmission node is within the voltage range, concluding that the power receiver side is coupled to the power supplier side and no foreign object exists; and when the voltage at the supplier transmission node is not within the voltage range, concluding that the power receiver side is not coupled to the power supplier side or a foreign object exists.

22. The foreign object detection method of claim 20, wherein the low current is a constant current, and wherein a level of the constant current is lower than a level of the high current.

23. The foreign object detection method of claim 20, wherein the low current is a pulsating current, and wherein an average level of the pulsating current is lower than a level of the high current.

* * * * *